United States Patent
Conner

(10) Patent No.: US 8,195,419 B2
(45) Date of Patent: Jun. 5, 2012

(54) GENERAL PURPOSE PROTOCOL ENGINE

(75) Inventor: George W. Conner, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 387 days.

(21) Appl. No.: 12/404,158

(22) Filed: Mar. 13, 2009

(65) Prior Publication Data
US 2010/0235135 A1 Sep. 16, 2010

(51) Int. Cl.
*G01R 31/00* (2006.01)
*G06F 19/00* (2011.01)

(52) U.S. Cl. ............ 702/119; 398/45; 709/223

(58) Field of Classification Search ........... 702/108, 702/119, 122, 123, 182, 186–188; 714/30, 714/712, 724; 709/223; 370/394; 703/11
See application file for complete search history.

(56) References Cited

U.S. PATENT DOCUMENTS

| 7,216,273 | B2 | 5/2007 | Phelps et al. |
| 7,222,261 | B2 | 5/2007 | Song |
| 2003/0033127 | A1 | 2/2003 | Lett |
| 2005/0204029 | A1* | 9/2005 | Connolly et al. ............ 709/223 |
| 2008/0089682 | A1 | 4/2008 | Sylvester et al. |
| 2008/0189580 | A1 | 8/2008 | Kim et al. |

OTHER PUBLICATIONS

International Search Report for PCT/US2010/027247 dated Oct. 25, 2010.

* cited by examiner

*Primary Examiner* — John H Le
(74) *Attorney, Agent, or Firm* — Wolf, Greenfield & Sacks, P.C.

(57) ABSTRACT

In one embodiment, a protocol aware circuit for automatic test equipment, which includes a protocol generation circuit constructed to retrieve protocol unique data and format the protocol unique data with a selected protocol definition corresponding to a device under test for testing the device under test. The protocol generation circuit may be constructed to retrieve the selected protocol definition from a protocol definition table.

32 Claims, 8 Drawing Sheets

| Drive Actions | Action | Notes |
|---|---|---|
| Drive 0 | Place Logical 0 at DUT input | |
| Drive 1 | Place Logical 1 at DUT input | |
| Drive Data | Place Program Data at DUT input | |
| Mask WR | Mask Data to be Placed at DUT input | Writes data or TOS bit if Masked |
| Pulse 0 | Pulse Logical 0 to DUT input | Clk Channel, Tester is master |
| Pulse 1 | Pulse Logical 1 to DUT input | Clk Channel, Tester is master |
| Stay | Hold drive State | |
| Compare Actions | | |
| Expect 0 | Expect to Receive Logical 0 at DUT output | |
| Expect 1 | Expect to Receive Logical 1 at DUT output | |
| Expect Data | Expect to Receive Program at DUT output | |
| Mask RD | Masked bits ignored | |
| Expect Valid | Strobe data, Ignore Error | |
| Hold if Lo | Hold bit count if condition true (Lo) | |
| Tester is slave | | |
| Hold if Hi | Hold bit count if condition true (Hi) | |
| Hold Until Change | Hold bit count until DUT output Changes | |
| Hold until Rising | Hold bit count until DUT output Rising | |
| Hold until Falling | Hold bit count until DUT output Falling | |
| Proceed on change | Wait for a change on 1 or more bits. | |
| Don't Care | | |
| I/O Actions | | |
| LoZ | Set DUT input to low impedance | |
| HiZ | Set DUT input to high impedance | |
| Pulse Lo-Z | Pulse DUT input to low impedance | For I²C |
| Pulse Lo-Z if H | Pulse only if DUT hi, otherwise slip bit count one bit time (hold bit position) | For I²C |

FIG. 3

| Transaction Opcodes | Operand | Rpt? | Notes |
|---|---|---|---|
| Write | Payload | Yes | Payload contains command, address and data. |
| Write with Mask | Payload | Yes | Data value from TOS if Masked, payload if not (RMW write) |
| Read | Payload | Yes | Payload contains cmd, add and expect data |
| Read with Mask | Payload | Yes | As Read but Masked bits are ignored |
| Read Until | Payload | Yes | As Read but repeated until data match (timeout needed) |
| Read Until with Mask | Payload | Yes | As Read Until but Masked bits are ignored |
| Read Until Change | Payload | Yes | As Read Until but repeated until one or more bits change state |
| Read Until Change Mask | Payload | Yes | As Read Until Change but Masked bits ignored |
| Read & Push to TOS | Payload | Yes | Read data pushed onto TOS (Expect Valid) |
| Read & Push & Set Mask | Payload | Yes | Read data pushed onto TOS and Mask value set (for RMW read) |
| Engine Update Opcodes | | | |
| Set Mask | Value | No | Payload update Mask (mask always <= # of payload bits) |
| Set Read Until Loop Cnt | Value | No | Number of transactions to query before fail |
| Set Repeat Count | Value | No | 0 = infinite |
| Flow Update Opcodes | | | |
| Notify Host (Set Host flag) | Value | No | Set Flag # |
| Issue ISL | Value | No | Issue ISL |
| Wait Until Host (rd flag) | Value | No | Wait until flag #, idle state otherwise |
| Wait Until ISL | Value | No | Wait until ISL #, idle state otherwise |
| Wait cycles | Value | No | Wait until, DUT clock cycles (minimum = 1 transaction) |
| Stop | | No | Goto idle state |

*FIG. 7*

GENERAL PURPOSE PROTOCOL ENGINE

RELATED PATENT APPLICATIONS

The present application is related to U.S. patent application Ser. No. 11/929,984, filed Oct. 30, 2007, entitled PROTOCOL AWARE DIGITAL CHANNEL APPARATUS, by George W. Conner and to U.S. patent application Ser. No. 11/930,052, filed Oct. 30, 2007, entitled A METHOD FOR TESTING IN A RECONFIGURABLE TESTER, by George W. Conner, both assigned to the same assignee as the present invention, both incorporated herein by reference in their entirety.

BACKGROUND

Automated stored pattern functional testing affords a critical step in the production of integrated circuit (IC) devices to provide parametric and operational characterization of the devices. An automatic test equipment system includes test circuitry that is connected to a control computer or host computer. The control computer provides a user interface that accepts and stores functional test pattern data for activating the test circuitry to provide stimulus signals to a device under test and receives the response signals from the device under test. The response signals are evaluated to determine the parametric and operational characterization of the integrated circuit devices.

The device under test (DUT) is mounted on a device interface board or DIB, which provides the physical interface for physical signals from and to the pin electronics. The test stimulus signals from the test circuitry are supplied through pin electronics to the device under test via the DIB. The test response signals from the device under test are transferred through DIB to the pin electronics and on to the test circuitry. The test stimulus signals and the test response signals are correlated by the test circuitry to determine whether the device under test has passed or failed the test.

The stimulus signals generated by the test circuitry include data signals and clock signals to synchronize the stimulus input. The effectiveness of the test depends on the accurate placement of these signals relative to one another. For example, several different signals, such as, clock, data, and enable signals are coordinated and triggered at appropriate times to ensure that meaningful data is acquired during the test process. Various integrated circuit functions have interface specifications that comply with fixed timing and data protocols. For instance, these protocols include an n-wire serial structured bus such as Ethernet Management Data Input/Output (MDIO), Universal Serial Bus (USB) or Inter-Integrated Circuit (I²C) Bus, a parallel communication bus such as General Purpose Input/Output (GPIO), a memory bus such as double data rate Dynamic Random Access Memory (DDR), and high speed communication channels such as High-Definition Multimedia Interface (HDMI).

As described above, in recent years stored pattern functional testing has run into increasing difficulties with devices that do not behave deterministically. Presently, the level of integration and complexity of semiconductor processing is allowing for integrated circuit chips to effectively be a complete "system-on-a-chip" (SOC). A system-on-a-chip integrates all the functional circuit elements of a computer or other electronic system into a single integrated circuit (chip). These integrated circuit elements may be any combination of digital circuits, analog circuits, random access memory, mixed analog and digital signal circuits, and often include radio-frequency functions.

A system-on-a-chip (SOC) provides multiple digital and analog integrated circuit functions incorporated on the same semiconductor substrate. An example of an SOC is a cellular telephone that incorporates not only cellular telephone receiving, processing, and transmitting functions, but also photographic and video processing functions, audio digital signal processing and semiconductor memory circuits. Presently, in most SOC testing, the individual functions of an SOC are tested separately in multiple testing methods, such as by SCAN testing, Built-In-Self-Test (BIST), and functional testing. System Level Test typically employs custom circuitry and is generally only used for high average selling price low mix devices, such as microprocessors. A final system level test may be implemented on customized test apparatus created specifically for the testing of specific SOC devices such as microprocessors. Although it would be desirable to perform a System Level Test for other SOC devices, building custom functional test apparatuses for low average selling price SOCs is not cost effective.

A difficulty in testing SOCs with automatic test circuitry is that the parametric and individual functional testing with the automatic test circuitry is a deterministic test operation. The test stimulus signals are applied with certain timing and structure, and the test response signals are expected to have a particular timing and structure. If the test response signals do not match the expected timing and structure for the given parameters, the SOC device under test is determined to have failed. The functions of the SOC device may operate with differing timing and clocking specifications and may operate asynchronously. An SOC device may be operational when the response test signals indicate otherwise, when the asynchronicity of the communicating functions cause the test response signals to appear incorrect.

The current generation automated test equipment systems have very limited capability to deal with non-deterministic SOC devices other than to provide certain latency factors. This causes the test engineer significant problems, in that the first prototyped devices, more than likely, will not work when the test stimulus signals are the simulation vectors used in the design verification. A series of trial and error loops ensues in which the test engineer tries to move vectors around until he finds a passing arrangement. Due to the large volume of data involved and the need to re-simulate every trial, each loop may take days, the net result being months added to the test and evaluation phase of a new SOC device.

There have been attempts within present automatic test equipment systems to simulate the operating conditions of an SOC device under test. Because of the nondeterministic function of the asynchronous communication between circuit functions, the normal operating environment of the functions can not be accurately recreated for the SOC device under test. Present automatic test equipment environments lack the ability to easily and accurately provide the nondeterministic electrical and timing conditions of the normal operating environment of the SOC device under test. This lack of the nondeterministic electrical and timing conditions within automatic test equipment systems, further do not measure the margin of error for an SOC device under test with regard to its tolerance under varying operational conditions that may be present in its normal operational environment. Therefore, what is needed is a protocol generation circuit or engine within automatic test equipment for generating stimulus signals and timings that comply with a specified device protocol expected by a device under test and receiving response signals according to the timings that comply with the specified device protocol.

SUMMARY

In one embodiment, a protocol aware circuit for automatic test equipment, which includes a protocol generation circuit constructed to retrieve protocol unique data and format the protocol unique data with a selected protocol definition corresponding to a device under test for testing the device under test. The protocol generation circuit may be constructed to retrieve the selected protocol definition from a protocol definition table.

In one implementation, a method for generating signals and timings that comply with a specified device protocol for communication between automatic test equipment and a device under test, the method includes receiving fixed protocol data for the device under test, receiving protocol unique data; and assembling the fixed protocol data and the protocol unique data into the specified device protocol for testing the device under test. The implementation may further include receiving a protocol definition location number, selecting fixed protocol data for the specified device protocol from a table location indicated by the protocol definition location number, and supplying the fixed protocol data and the protocol unique data in the specified device protocol for testing a device under test. In some implementations, the method further includes receiving an operation code and retrieving action data from a table location corresponding with the operation code, and supplying the action data along with the fixed protocol data and the protocol unique data in the specified device protocol for testing a device under test. In other implementations, retrieving the fixed protocol data for the specified device protocol includes retrieving action data, and supplying the fixed protocol data includes supplying the action data.

BRIEF DESCRIPTION OF THE DRAWINGS

FIG. 3 is a table of exemplary operational actions for construction of a specified device protocol within one embodiment of an automatic test system.

FIG. 7 is a table of example operation codes.

DESCRIPTION

A protocol specific circuit containing the particular protocol(s) for a specific SOC stored in an FPGA may be utilized to improve testing. Such an approach, however, could be too time consuming or limiting in some applications. Different SOC's, may require one or more different protocols. Various SOC's may include one or more of an n-wire serial structured bus such as Ethernet Management Data Input/Output (MDIO), Universal Serial Bus (USB) or Inter-Integrated Circuit (I²C) Bus, a parallel communication bus such as General Purpose Input/Output (GPIO), a Memory such as double rate Dynamic Access Memory (DDR), and high speed communication channels such as High-Definition Multimedia Interface (HDMI), or others. An advantage of a tester that is capable of generating a large number of different protocols for various DUT's is that it can increase tester functionality and improve test efficiency.

Figure 1:
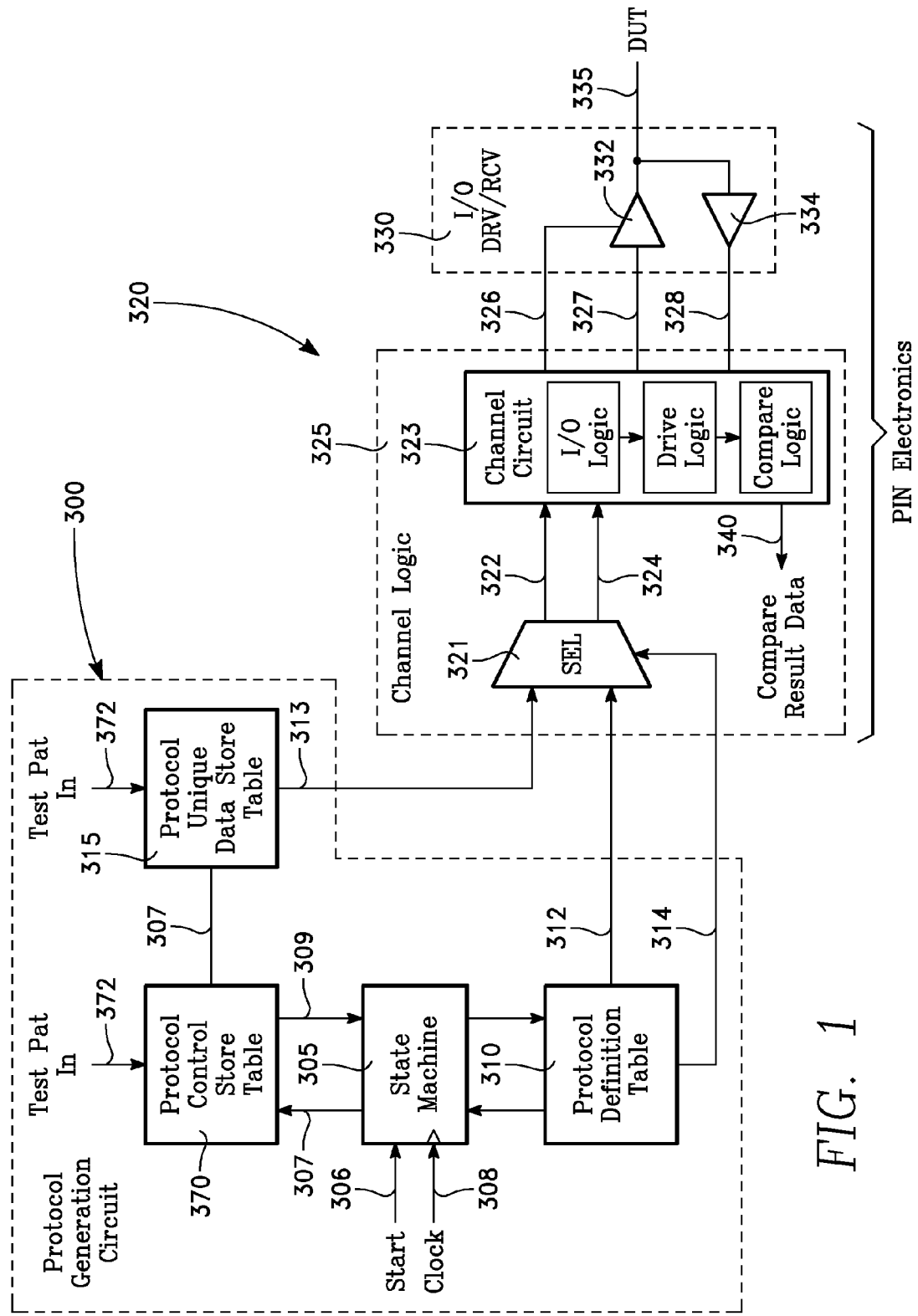
FIG. 1 is a simplified block diagram of an embodiment of a protocol generation circuit.

FIG. 1 is a simplified block diagram of an embodiment of a protocol generation circuit 300 and its interconnection with the pin electronics 320. The test pattern commands 372 may be input to a host device, stored in a Dynamic Random Access Memory (DRAM) (not shown), and transferred to the protocol control storage table 370. The protocol control storage table 370 stores the Opcodes that define the commands for constructing the stimulus signals and timings that comply with a specified device protocol. The Opcodes may be decoded, or partially decoded, or structured to directly provide the control signals for generating the stimulus signals and timings that comply with a specified device protocol. The Opcodes are transferred to the transaction state machine 305 through connection 309. At the activation of the Start signal 306, the transaction state machine 305 provides a series of timing cycles which define execution order of the operational actions of the specified device protocol based on the operation code as synchronized by the clock 308. The timing cycle signals are transferred to the protocol definition table 310. Timing signals 307 also are transferred from the transaction state machine 305 to the protocol control storage table 370, to increment the transmission of the Opcodes 302 (shown in FIG. 2) and table number 304 (shown in FIG. 2). The timing signals 307 also are transferred to the protocol unique data storage table 315 to increment the transmission of the expect data 317 and drive data 319.

The test pattern commands 372 also contain a protocol definition location number which defines the location within the protocol definition table 310 that contains the set of fixed protocol data, which may in some embodiments further include corresponding action signals for the specified device. In other embodiments, discussed below with reference to FIG. 2, the actions signals may be contained in a separate action table 350.

Referring to FIG. 1, the protocol aware test pattern commands 372 also contains the protocol unique data that is to be used for each of the transactions to be executed. The protocol unique data is placed in the protocol unique data storage table 315. The protocol unique data may be the data to be driven as stimulus signals to the device under test 335, expected data to be compared with the response signals from the device under test, or masking data used for the control of the flow of data during the execution of the transactions.

The pin electronics 320, as shown, includes the channel logic 325 and the I/O drivers 330. The channel logic includes a selector 321 and the channel circuit 323. The selector 321 receives the fixed protocol data 312 from the protocol definition table 310, and the protocol unique data 313 from the protocol unique data storage table 315. The action signals 314 from the protocol definition table 310 provide the control instructions for selecting whether the fixed protocol data 312 or the protocol unique data 313 are transferred to as selected data signals 322 or the command signals 324 are transferred to the channel circuit 323 to appropriately activate the channel circuit 323. The drive data output 327 of the channel circuit 323 is the input to the driver 332 of the I/O Driver/Receiver 330 of the pin electronics 320 to provide the protocol unique data 313 or the fixed protocol data 312 that is to be driven if the automatic test equipment is driving stimulus data to the device under test 335 according to the specified device protocol. Alternately, the Control output 326 of the channel circuit 323 provides the necessary control signal to the driver 332 to deactivate the driver 332 when the automatic test equipment is receiving response signals from the device under test 335. The receiver 334 is connected to receive the response signals from the device under test. The receiver 334 is connected to transfer the received data 328 to the channel circuit 323. The channel circuit 323 receives the expected protocol unique data 313 from the protocol unique data storage table 315 and the expected fixed protocol data 312 from the protocol definition table 310. The expected protocol unique data 313 and the fixed protocol data 312 are compared with the response signals from the receiver 334 to determine whether the device under test 335 is functioning correctly. The channel circuit 323 provides a compare result signal 340 that is transferred to a failure processor (not shown).

Figure 2:
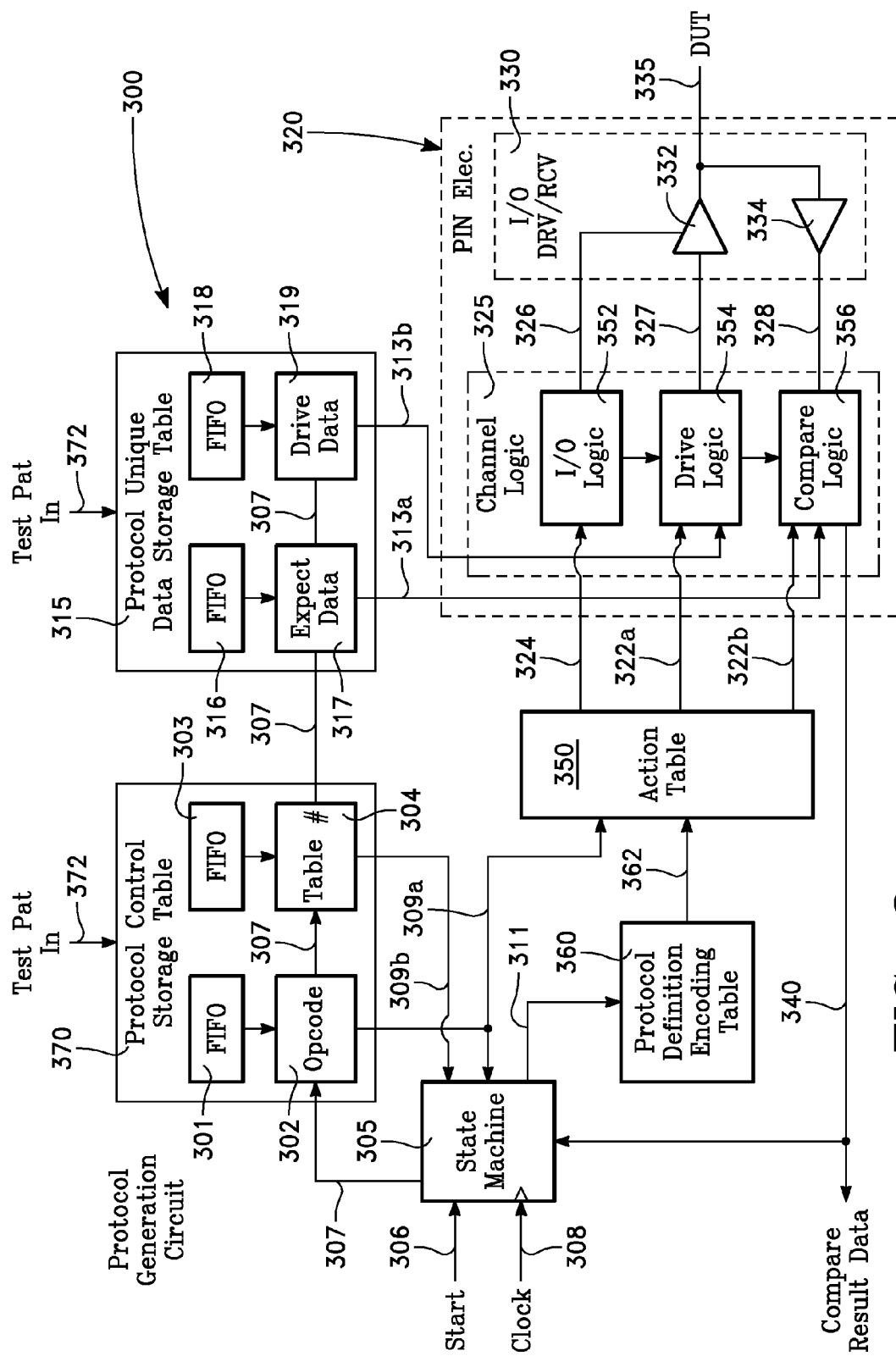
FIG. 2 is a simplified block diagram of another embodiment of a protocol generation circuit.

FIG. 2 is a simplified block diagram of another embodiment of a protocol generation circuit 370 and its connectivity to the pin electronic 320. The structure of this embodiment of a protocol generation circuit 370 is similar to that described above for FIG. 1. The protocol control storage table 370 includes a First-In-First-Out (FIFO) memory 301 that acts as a high speed buffer for the Opcodes. The output of the FIFO 301 is transmitted to state flip-flop 302. The protocol control storage table 370 transmits the Opcodes 309a on the connection to the transaction state machine 305 and the action table 350. As described above, the transaction state machine 305 provides a series of timing cycles which define the execution order of the operational actions of the specified device protocol based on the operation code as synchronized by the clock 308, at the activation of the Start signal 306.

The protocol control storage table 370 also includes a FIFO memory 303 that acts as a high speed buffer for the protocol definition location numbers. The output of the FIFO 303 is transmitted to table number state flip-flop 304. The table number state flip-flop 304 transmits the protocol definition location number on the connection 309b to the transaction state machine 305 which are then passed through the connection 311 to the protocol definition table 360 to provide the location within the protocol definition table 360 that contains the set of fixed protocol data 362 for constructing the data and timings of the specified device protocol.

The protocol unique data storage table 315 includes a FIFO memory 316 that acts as a high speed buffer for the expected data to be compared with the response signals from the device under test. The output of the FIFO 316 is transmitted to state flip-flop 317. The state flip-flop 317 transmits the expected data on the connection 313a to the compare logic 356 of the channel logic 325. Similarly, the protocol unique data storage table 315 includes a FIFO memory 318 that acts as a high speed buffer for the protocol unique data that is to be driven to the device under test according to the specified device protocol. The output of the FIFO 318 is transmitted to state flip-flop 319. The state flip-flop 319 transmits the drive data on the connection 313b to the drive logic 354 of the channel logic 325.

In this embodiment, separate protocol definition and action tables 360 and 350, respectively, are provided. This is to make use of the fact that in some embodiments, for any given protocol there is a subset of actions that can take place for each bit time. FIG. 3 is a table of example operational actions which may be used for construction of a specified device protocol within an automatic test equipment system. These actions may include Drive 0 or Drive Data, Hold if Lo, Proceed on Change, or Pulse Lo-Z if H. FIG. 3 is an example list, others actions are possible. Any additional actions may be added to the list and the protocol generation engine 370 updated to accommodate them. In some embodiments there are only a limited number of drive actions, a limited number of compare actions, and a limited number of I/O actions that can take place for each bit time. The protocol definition table 360 stores fixed protocol data and the action table 350 stores the actions corresponding to the Opcodes 309a. The Opcodes 309a and the fixed protocol data 362 provide pointers to the locations in the action table 350 that select the signals for guiding the selected data signals 322a and 322b, and the command signals 324 to appropriately activate the channel logic 325. The output 322a of the action table 350 guides the fixed protocol data 362 from the protocol definition table 360 to the drive logic 354 within the channel logic 325. Similarly, the output 313b of the drive data state flip-flop 319 provides the protocol unique data 313a and 313b to the drive logic 354. The drive logic 354 provides the stimulus data to the driver 332 and thus to the device under test 335.

The output 322b of the action table 350 guides the fixed protocol data 362 from the protocol definition table 360 to the compare logic 356 within the channel logic 325. Similarly, the output 313a of the expected data state flip-flop 317 provides the expected protocol unique data 313a to the compare logic 356. The compare logic 356 receives the response data from the device under test 335 through the receiver 334. The compare logic 356 provides a compare result signal 340 that is transferred to the transaction state machine 305 and a failure processor (not shown).

The output of the action table 350 contains the action signals 324 to the I/O logic 352 of the channel logic 325. The I/O logic 352 activates the appropriate controls of the drive logic 354, the compare logic 356, and the driver 332 of the I/O Driver/receiver 330 to generate the appropriate transaction, bit by bit for determining the operational status of the device under test 335.

Figure 4A:
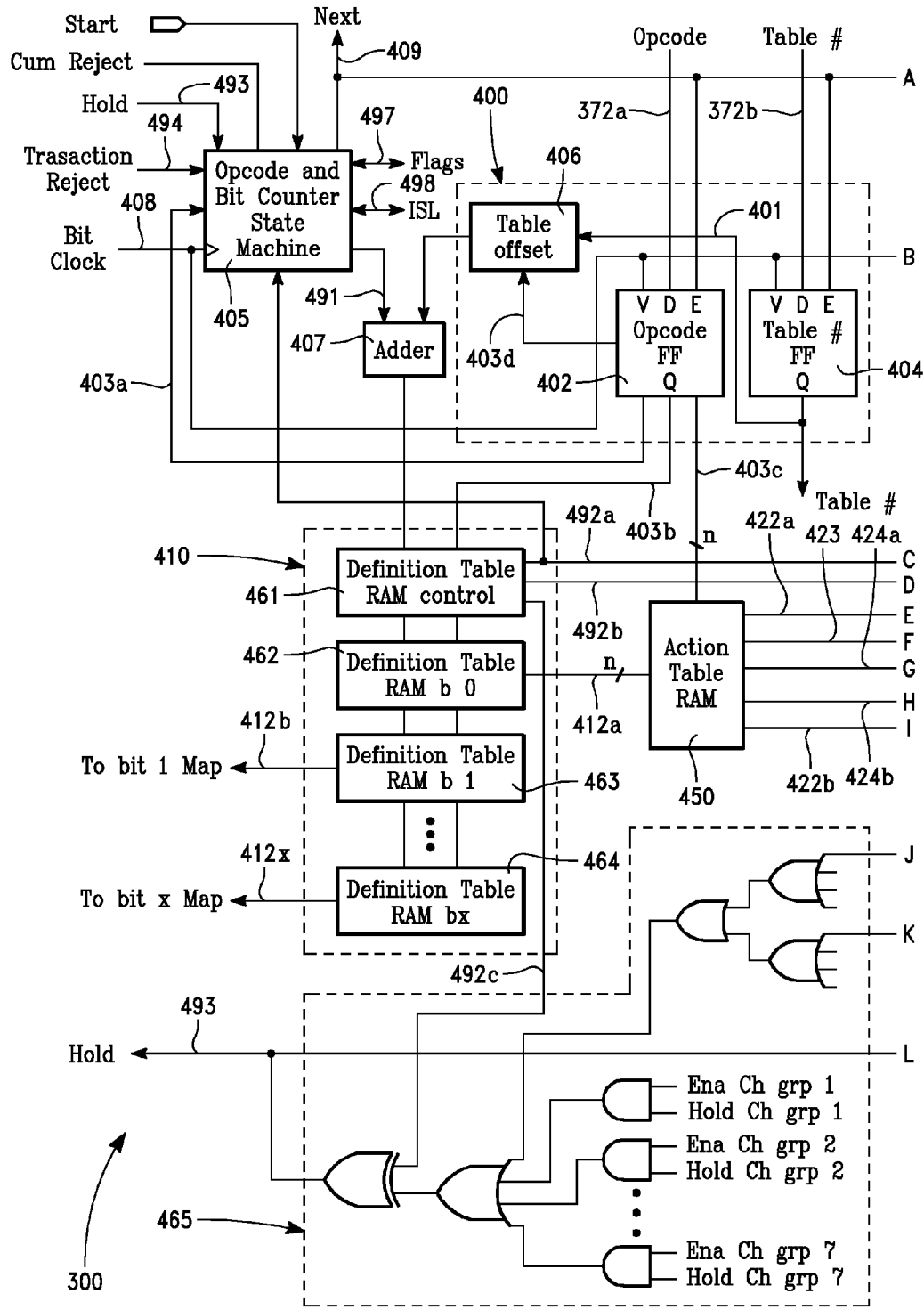
FIGS. 4A and 4B are more detailed block diagrams of still another embodiment of a protocol generation circuit.
Figure 4B:
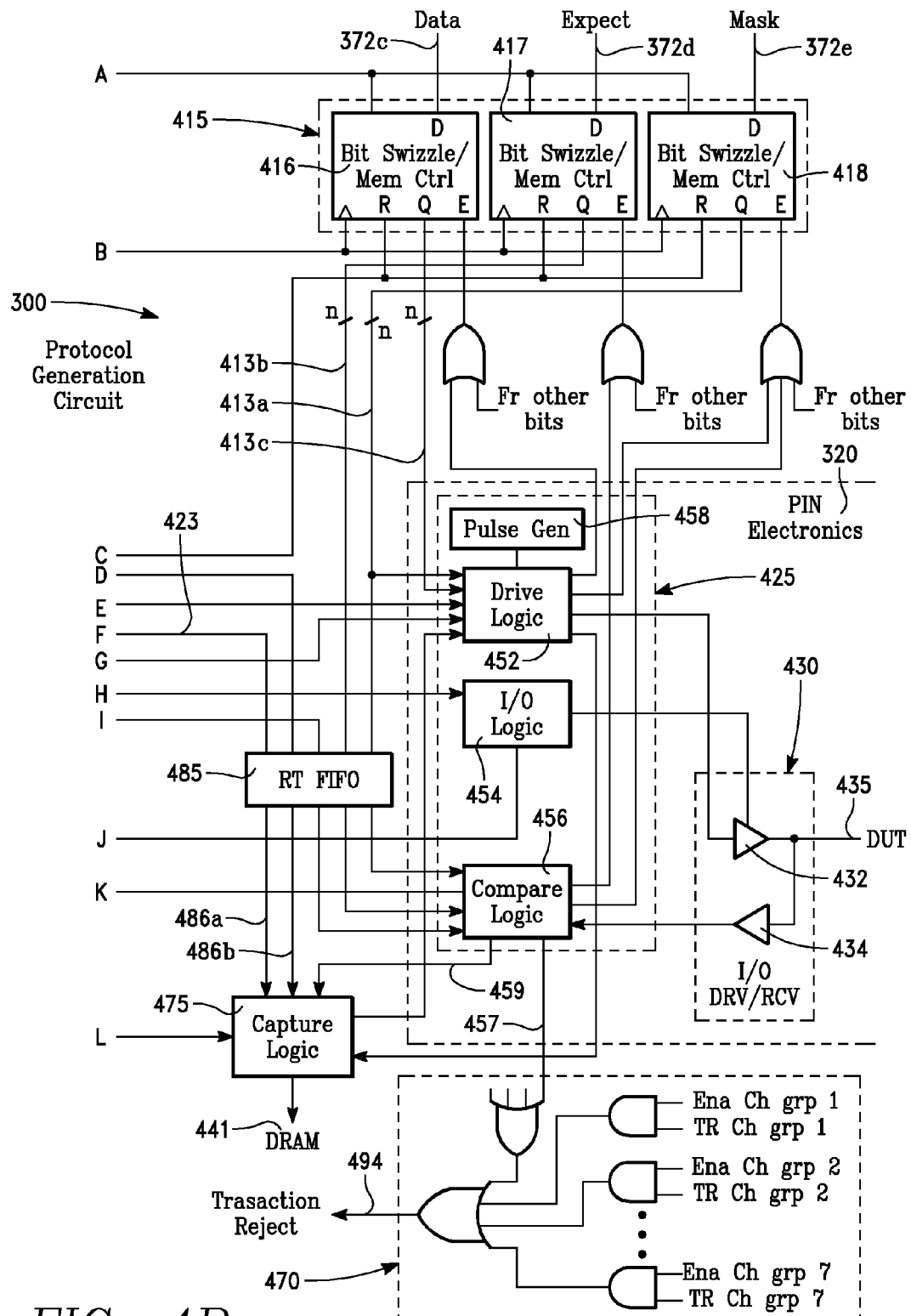

FIGS. 4A and 4B are more detailed block diagrams of still another embodiment of a protocol generation circuit 370 with its interconnection to the pin electronics 320. The source data storage concept of the protocol generation circuit 370 within automatic test equipment of this embodiment is to store as little information as possible in Dynamic Random Access Memory (DRAM) (not shown). This means that only Opcode, table number and payload bits (data bits) are to be stored in the DRAM (not shown). All constant protocol specific bits (like start/stop bits or care bits) are stored in the protocol definition table 410 and thus take no space in DRAM (not shown). The DRAM (not shown) provides test pattern data for the Opcode 372a, for the table number 372b, the drive data 372c, expect data 372d and the masking data 372e. The Opcode 372a and the table number 372b are the inputs to the protocol control storage table 400. The drive data 372c, the expected data 372d, and the data mask bits 372e are the inputs to the protocol unique data storage table 415.

The loading sequence proceeds once the protocol execution state machine 405 issues a Next command 409. An Opcode is clocked into the Opcode state flip-flop 402 and a table number is clocked into the table location state flip-flop 404. The Opcode is decoded sufficiently to determine if this is a read, write or mask update transaction. The drive data 372c, expect data 372d and data mask 372e sizes are looked up in a small RAM. The protocol execution state machine 405 then loads the proper number of into block Random Access Memories (RAMs) that are used in this case as FIFO's (not shown). The outputs of the FIFO's are the inputs to the drive data flip-flop 416, the expected data flip-flop 417, and the data mask flip-flop 418.

The drive data flip-flop 416, the expected data flip-flop 417, and the data mask flip-flop 418 are used by the protocol execution state machine 405 to service protocols with varying data width requirements all the way from a single serial stream to multiple bit wide busses. Further, multiple protocol generation circuits may be grouped to service wider busses. The bit swizzle of the drive data flip-flop 416, the expected data flip-flop 417, and the data mask flip-flop 418 will be programmed at start of a burst to convert a number of the bits out of the RAM into 1, 2, 4 or any number of bits to the protocol execution state machine 405 as required by the protocol.

The enable lines of the drive data flip-flop 416, the expected data flip-flop 417, and the data mask flip-flop 418 indicate that the next set of data should be output on the next bit clock. The reset line is used in the special case of a wait until or Repeat Opcode. In this case, if the condition has not been met (Transaction Reject has occurred or Repeat not done), the transaction needs to be repeated. A Last Bit signal without a Next Command 409 means that the FIFO's should reset the memory pointer to repeat the transaction.

The output of the protocol control storage table 400 and the protocol unique data storage table 415 will then have the Opcode, protocol definition location number, drive data 413a, expect data 413b and data mask bits 413c all properly aligned at the start of the next transaction. The Opcode state flip-flop 402 is a multiple output register containing the decoded or partially decoded Opcode. One set of the outputs of the Opcode state flip-flop 402 provides an initial definition code 403a to the protocol execution state machine 405 for initializing the protocol execution state machine 405 state counter. A portion of the Opcode is a read/write transaction bit 403b is then transferred from the Opcode state flip-flop 402 to the protocol definition tables 410. The transaction definition 403c is transferred from Opcode state flip-flop 402 to the action table 450. A transaction offset portion 403d of the Opcode is combined with the table location 401 from the table location state flip-flop 404 in the table offset calculator 406 to generate the exact offset location from the beginning pointer of the table location 401 for each transaction being executed. The table location bits 491 from the protocol execution state machine 405 are combined with the output of the offset calculator 406 in the adder 407 to determine the exact location within the protocol definition table 410 the definition and the fixed data for the next transaction.

This embodiment of the protocol generation circuit 370 is structured for controlling multiple channels of the automatic test equipment to stimulate multiple pins of the device under test 435. To accomplish this, the protocol definition table 410 includes multiple definition table RAM's 461, 462, 463, and 464 and separate action tables 450. The multiple definition table RAM's 461, 462, 463, and 464 communicate through separate action tables 450 to the channel logic circuitries 425 and the I/O Driver/Receiver 430 of the pin electronics 320 to separate pins of the device under test 435. In automatic test equipment incorporating this embodiment of the protocol generation circuit 370, the protocol generation circuit 370 supports eight channels communicating with eight pins of the device under test 435. Multiple protocol generation circuits 370 are optionally ganged together to support wider bus widths for instance a 64 bit bus. The ganged protocol generation circuits 370 would execute identical Opcodes. The multiple definition table RAM's 461, 462, 463, and 464 would contain different definition signals for signals to be applied to the pins of the device under test based on the function for each of the pins.

The table offset calculator 406 and Adder 407 generate an offset address for the transaction definition address as different multiple definition table RAM's 461, 462, 463, and 464 are executed. Each new transaction for both read and write may have different lengths and different definitions. The table offset calculator 406 and Adder 407 are programmed with the offset for each transaction type. This allows many short transaction types or fewer long ones within the multiple definition table RAM's 461, 462, 463, and 464 as long as the total length of all transactions does not exceed the available storage space in the multiple definition table RAM's 461, 462, 463, and 464.

The protocol definition table 410 includes a protocol definition control table 461 that provides additional bits (3 bits for this implementation) for general housekeeping functions. The bits are defined as Last bit 492a, Store 492b, and Invert Hold Sense 492c. The Last Bit informs the protocol execution state machine 405 that the last bit of a transaction is transmitted. The protocol execution state machine 405 issues a Next command. The Next Command is issued if the following transaction is not being held, a repeat count is reached, there are no wait conditions, or it can repeat the previous transaction. The Store defines which cycles are store cycles. The actual bits to be stored are defined before the burst by the setup of the Capture Logic 475. The Invert Hold Sense inverts the sense of the Hold line 493. The function of the Hold line 493 is explained hereinafter.

The outputs 412a, 412b, . . . 412x of the multiple protocol definition table RAM's 462, 463, and 464 are applied to their individual action tables 450. The action table 450, mainly gets its address from the protocol definition table RAM 462, but a certain number (i.e. 2) of the address bits 403c come from Opcode state flip-flop 402. This is to handle cases in which the Opcode changes the action of certain bits of the transaction, for example Read and Mask Read. In alternate embodiments the changes in the actions could be handled by adding transaction types to the protocol definition table RAM 462. However, the protocol definition table RAM 462 is relatively expensive versus the action table 450, thus making the address bits 403c a more desirable implementation.

The fixed protocol data signals 422a and the transaction command signals 424a from the outputs of the action table 450 are the inputs to the channel logic 425. The command signals 424a include the Hold signal that indicates that one of the hold actions is being executed and the condition has not been met. A pulse time signal in the command signals 424a is a timed pulse used by the pulse generator 458 to generate clock pulses for the device under test 435. An enable mask in the command signals 424a allows the reading of the mask bit from the data mask flip-flop 418. The fixed protocol data 412a is stored to the protocol definition table 462 and transmitted to the action table 450 for decoding to generate the fixed protocol data 422a. The fixed protocol data 422a is transmitted to the channel logic 425. The protocol unique data 413a is transmitted from the drive data flip-flop 416 to the channel logic 425. The data masking bit 413c is transmitted from the data mask flip-flop 418 to the channel logic 425. A function select bit of the command signals 424a select the source of the data to transmitted to the pin of the device under test 435. The output of the drive logic 452 is the input of the pin driver 432 of the I/O Driver/Receiver 430.

The command signals 424b are the inputs to the I/O logic 454. The I/O logic 454 controls the pin driver 432. When the pin driver 432 is actively driving data the I/O logic 454 sets the impedance control to allow the driving. Alternately, the I/O logic 454 allows the pin driver 432 to switch between a high impedance state or driving to a Lo state based on a timed pulse. The high impedance state allows the receiver 434 of the pin electronics 430 to receive data from the device under test 435. Alternately, some protocols have special coding where clock lines are pulled low for signaling purposes (i.e. I²C). The impedance control facilitates these functions.

The output of the receiver 434 is the input to the compare logic 456. The compare logic 456 implements the Compare Actions of FIG. 3. The compare logic 456 compares response data from the device under test 435 as acquired by the receiver 434 with expected data 413b from the expected data state flip-flop 417. Additionally the compare logic 456 receives the data mask bits 412c from the data mask flip-flop 418. The results of the comparison of the response data and the expected data 413b and the data mask bits 412c determine if the transaction has failed. Further the compare logic 456 manages the various hold conditions for the flow control of the protocol generation circuit 370.

As part of the flow control of the protocol generation circuit 370, the round trip FIFO 485 delays the expected response data 413b and data mask bits 413c to move them later in time by the round trip time through the device under test 435. The delay allows the compare logic 456 to compare the response data from the device under test 435 with the one of the drive data 413a, expected response data 413b and data mask bits 413c. Additionally, the round trip FIFO 485 delays the transaction table number 423 from the action table 450 for alignment with the compare result data 459 in the capture logic 475. The round trip FIFO 485 delays the expected fixed data signals 422b for comparison in the compare logic 456 with the response data from the receiver 434.

The next function of the flow control of the protocol generation circuit 370 is the Hold OR tree 465. The Hold OR tree 465 receives Hold and Enable signals from the I/O Logic 454 and the compare logic 456 of each of the channels being grouped for the protocol being emulated by the protocol generation circuit 370 or groups of ganged protocol generation circuits 370. The Hold output 493 of the Hold OR tree 465 is transferred to the protocol execution state machine 405 and the capture logic 475 to insure proper flow of the protocol being emulated in the testing of the device under test 435. The loop time from action table 450 output to device under test 435 and back then through the Hold OR tree 465 to the protocol execution state machine 405 sets the maximum device under test frequency.

One of the outputs of the compare logic 456 is the transaction reject signal 457 that is transferred to the transaction reject OR tree 470. The transaction reject signal 457 provides a signal that the device under test 435 has failed at one or more of the transactions occurring at a particular bit transaction time. All the transaction reject signals 457 of each of the channels being grouped for the protocol being emulated by the protocol generation circuit 370 or groups of ganged protocol generation circuits 370 are the inputs to the transaction reject OR tree 470. The output 494 of the transaction reject OR tree 470 is an input to the protocol execution state machine 405 to provide condition indications of the progress of the generation of the protocol for testing the device under test 435.

The capture logic 475 receives the compare result data signal 459 from the compare logic 456 describing the state of the comparison of the response data from the device under test 435 with the expected data 413b. The compare logic also receives the delayed transaction table number 486a and the delayed store signal 486b from the round trip FIFO 485. The capture logic 475 captures the read data from the compare result data signal 459 for use at a later time for Read/Modify/Write operations. The capture logic 475 stores the compare result data signal 459 with a timestamp and the table number 486a for correlation with data with other protocol generation circuits 370. The compare result data signal 459 with a timestamp and the table number 486a is transferred to the DRAM 220.

As described above, the protocol execution state machine 405 provides a series of timing cycles which define the operational actions of the specified device protocol based on the Opcode as synchronized by the clock 408. The timing cycle signals are transferred to the protocol definition table 410. The table location bits 491 are transferred from the protocol execution state machine 405 to adder 407 and thus to the protocol definition table 410 for accessing the transaction data for forming the protocol for generating the stimulus signals to be sent to the device under test and receiving and evaluating the response from the device under test.

Other functions of the protocol execution state machine 405 include providing flags 497 that are used to communicate with the Host. The protocol execution state machine 405 can set or compare to any combination of a limited number of flags. The operand of the flag 497 will contain mask bits, write bits or compare flags. In the case that multiple protocol generation circuits 370 are ganged, only one protocol execution state machine 405 is used for Flags and the other protocol execution state machines 405 will receive status from the master unit.

The latency synchronization signal line (ISL) 498 is used by the master protocol execution state machine 405 for dispatching the initiation of a particular protocol action across protocol execution state machines 405.

Figure 5:
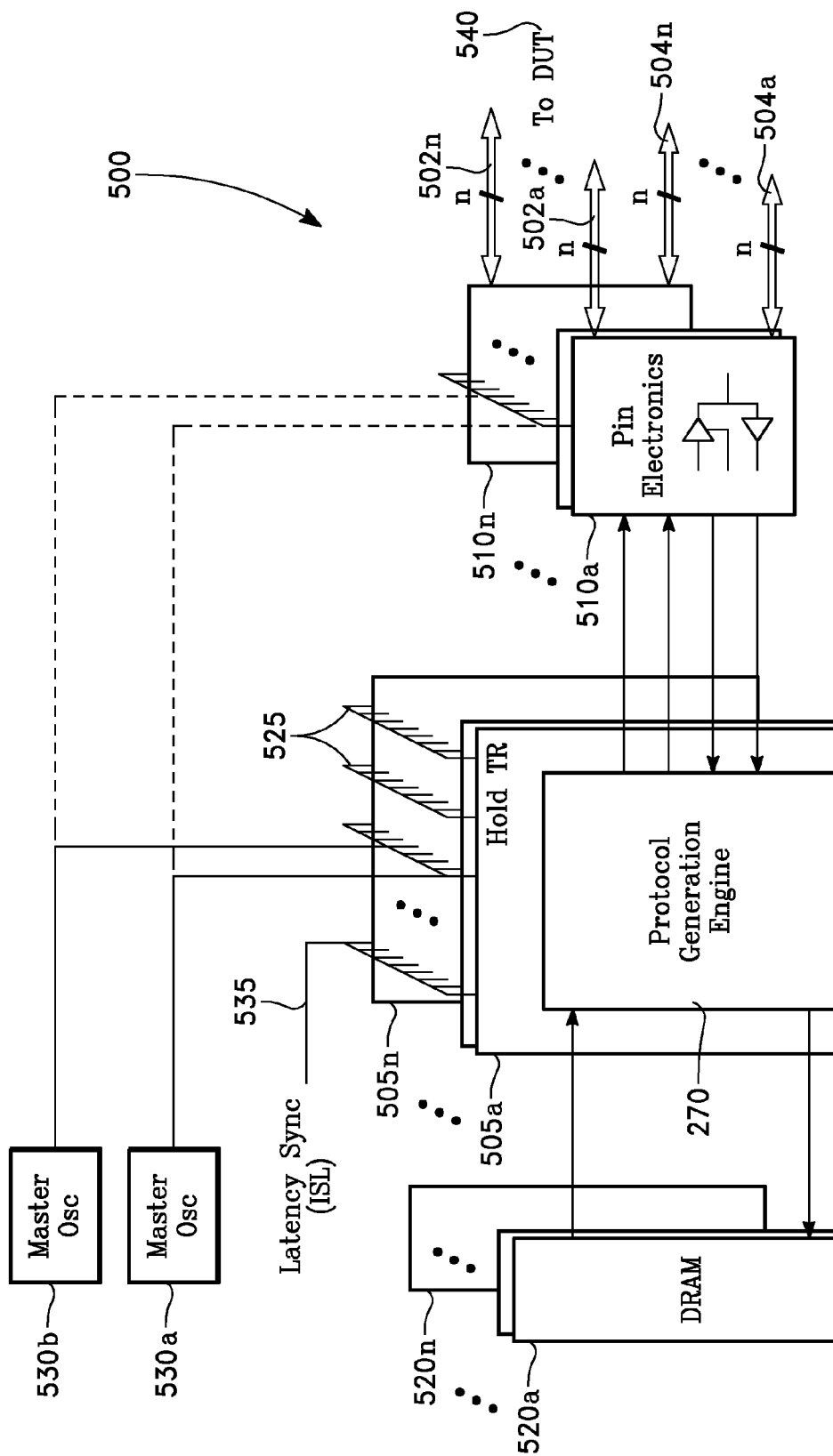
FIG. 5 is a block diagram of an automatic test equipment system incorporating multiple instances of one of the embodiments of the protocol specific circuits incorporating the protocol generation circuit of FIGS. 1, 2, or 4A and 4B.

FIG. 5 is a block diagram of an automatic test equipment system 500 incorporating multiple instances of one of the embodiments of the protocol specific circuits 505a, ..., 505n incorporating the protocol generation engine 370 of FIGS. 1, 2, or 4A and 4B. The automated test equipment system 500 has multiple channels of the protocol specific circuits 505a, 505n that are connected to multiple pin electronic units 510a, 510n. Each of the multiple pin electronic units 510a, ..., 510n as described above provide the electrical interface 502a, ..., 502n and 504a, ..., 504n between the SOC device under test 540 and the automated test equipment system 500 through the physical interconnections of the load adapter. Each of the protocol specific circuits 505a, ..., 505n is connected to at least one of the multiple pin electronic units 510a, ..., 510n to provide the test stimulus signals to and receive the test response signals from the SOC device under test 540.

Each of the protocol specific circuits 505a, ..., 505n has a protocol generation circuit 370 that functions as those described in FIGS. 1, 2, or 4A and 4B, in coordination with the remaining circuitry of the protocol generation circuit 370. Each protocol generation circuit 370 of the protocol specific circuits 505a, ..., 505n communicates with its designated DRAM 520a, ..., 520n to provide the test commands and to log the test results of the exercising of the SOC device under test 540.

In protocols that have a large number of pins, the protocol specific circuits 505a, ..., 505n coordinate the decoding of the commands and generate the test response signals that simulate the expected responses synchronously. To simulate the expected responses synchronously, the protocol specific circuits 505a, ..., 505n communicate through a synchronization communication interface 525 between those of the protocol specific circuits 505a, ..., 505n that may cooperate. The synchronization communication interface 525 contains the transaction rejection signals from the transaction reject OR tree and the HOLD signals from the Hold Or tree. This cooperation may effect the latency of the operation and thus the communication is structured to minimize the impact of the cross communication between the protocol specific circuits 505a, ..., 505n. For instance one of the state machines (not shown in FIG. 5) for the protocol generation circuits 505a, ..., 505n may act as a master and receive the test stimulus signals directly from adjacent protocol specific circuits 505a, ..., 505n for decoding. The master protocol aware controller (not shown) then dispatches the appropriate instructions for constructing the structure and timing of the test response signals specified by the protocol, while minimizing the impact of the latency for the operation. The latency synchronization signal line (ISL) 535 is used by the master protocol aware controller (not shown) for dispatching the initiation of a particular protocol action across multiple protocol specific circuits 505a, ..., 505n.

The automated test equipment system 500 may have multiple master oscillators 530a and 530b to generate the different timings determined by the protocol specific circuits 505a, ..., 505n. This is true especially for the deterministic operation of the automated test equipment system 500. In the non-deterministic operation of the automated test equipment system 500, the master oscillators 530a and 530b may be used for those portions of the testing involving deterministic operation while an exterior timing from the SOC device under test 540 may be used for the protocol aware controller (not shown) in non-deterministic operation.

Figure 6:
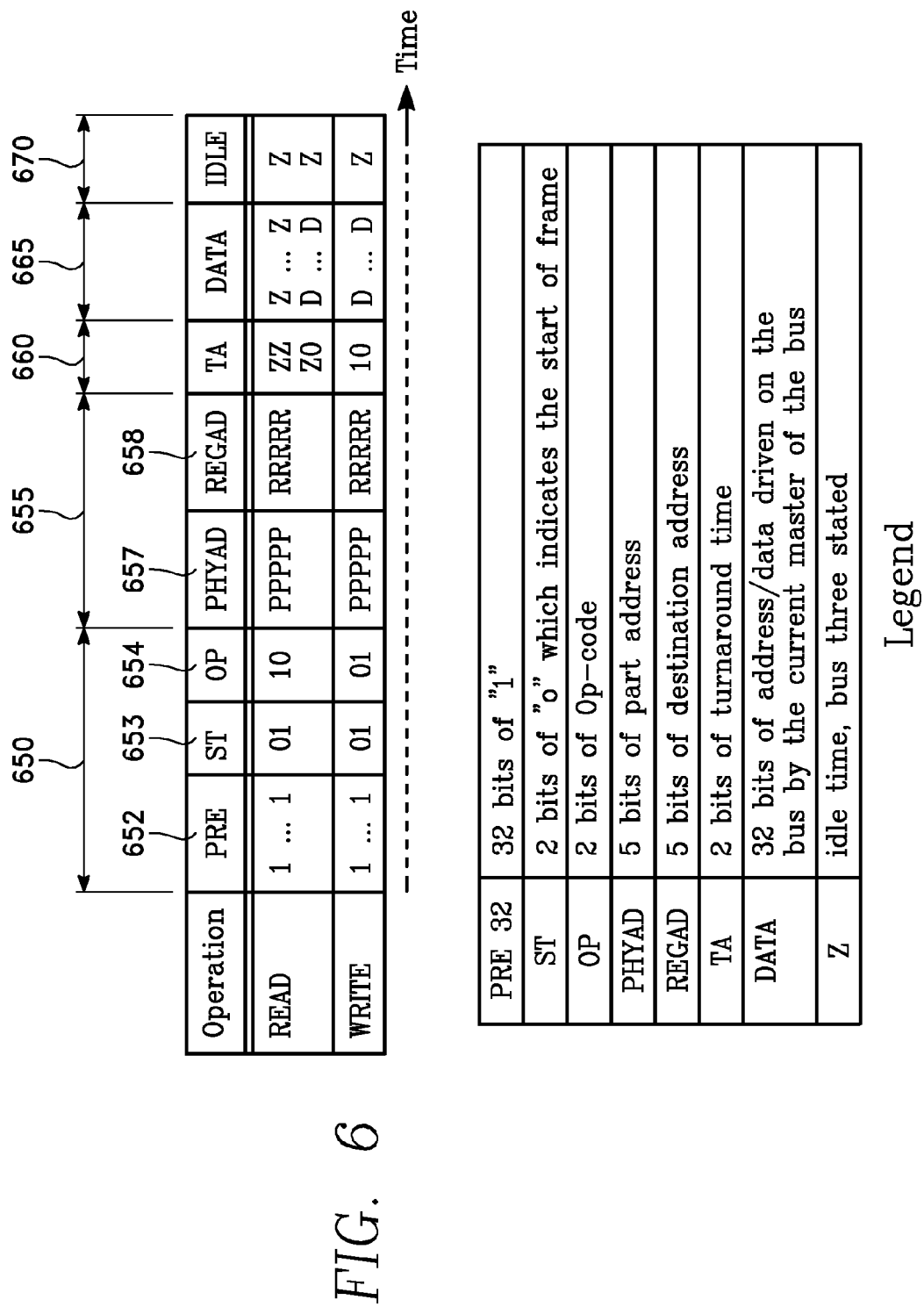
FIG. 6 is a diagram describing the relative structure and timing of the signals that comply with the Ethernet Management Data Input/Output (MDIO) protocol specification.

Refer now to FIG. 6 for an example diagram describing the signals and timings that comply with the Ethernet Management Data Input/Output (MDIO) protocol specification. The MDIO is a two pin serial bus protocol where one station on the bus acts as a master and all others on the bus act as slaves. The master generates a clocking signal for the bus and the operations as transmitted by the master are a READ operation and a WRITE operation. The beginning of each packet of the protocol begins with a preamble 652 followed by a start of frame 653 and an operation code 654. The fixed data 650 includes each of these codes and are defined to be stored in the protocol definition table. Even though there are separate operation codes, there are only two codes to define the operation codes. Placing them in the protocol definition table allows savings within the test patterns. The physical address 657 and the destination address 658 are generated with execution of the test pattern to generate the protocol and therefore unique drive and expected data 655 stored in the unique drive data FIFO. The turn around time bits 660 are dependent on the type of transaction being performed, however, they have few combinations and would be considered fixed data and stored in the protocol definition table. The address/data bits 665 are unique drive data to be stored in the unique drive data FIFO. The idle time bit times 670 actually provide a command that would be set to force the driver of the pin electronics to a high impedance state.

FIG. 7 is a table of exemplary Opcodes developed from the operational actions for definition of a specified device protocol. The Opcodes are now a "shorthand" command language that instructs a protocol generation circuit within automatic test equipment the timing and signals for each pin to execute the protocol. The Opcodes of this example are the transaction definitions for generating the timing and data structure of the protocol. The example Opcode definitions also include Engine Update Opcodes for the Host of the automatic test equipment to provide direct instructions for the protocol generation circuit. The Flow control Opcodes provide communication between groups of ganged protocol generation circuits, test pattern generator or the Host of the automatic test equipment in order to control test pattern flow.

The protocol generation circuit makes use of the fact that for any given protocol there are only a small set of actions, for example as shown in FIG. 3, that can take place for each bit time. From these actions, it is possible to assemble a series of the actions for each pin of a protocol and thereby generate the protocol. This string of actions is contained in the protocol definition table. The actions are structured as a set of Opcodes that define the type of transaction: read, write, read until, etc. The table number within the protocol definition table informs the state machine which of multiple transaction definitions apply for this particular transaction. The expected response data is the unique data contained in a read transaction from the automatic test equipment perspective. The drive stimulus data is the unique data for both write and read transactions (there could be unique drive data in a read transaction: for example, address). A protocol execution state machine retrieves the protocol definition for the transaction selected by Opcode and table number; the Opcode is decoded in the action table into specific enable bits; these enable bits are combined with the drive stimulus and expected response data in the channel logic to generate the appropriate transaction, bit by bit. When the transaction is complete, the protocol execution state machine advances to the next Opcode, table number and Data. Protocols wider than a single bit are generated by duplicating the protocol generation circuits over the multiple bits.

Referring to FIGS. 1 and 2, in one embodiment, the protocol control definition table 310 or 360 provides a protocol definition storage means. The protocol control storage table 370 provides a means for selecting and retrieving a protocol definition from the protocol definition storage table 360. The protocol unique data storage table 315 is a means to deliver test data for testing the DUT. In some embodiments, the action table 350 may be provided to use the selected protocol definition as part of the means to provide the test data for testing the DUT.

As is understood by a person skilled in the art, a program storage device can be created that contains reconfiguration instruction code that is executable on a computing device coupled to a reconfigurable integrated circuit such as a field programmable gate array. The reconfiguration instruction code when executed configures internal circuitry of the reconfigurable integrated circuit to form a protocol generation circuit as described in FIGS. 1, 2, or 4A and 4B. The reconfigurable integrated circuit, as configured, performs a process for generating signals and timings that comply with a specified device protocol for communication between automatic test equipment and a device under test.

It is understood that the term "table" as used herein may include a memory storage device containing stored and retrievable information, or other devices capable of such.

While this invention has been particularly shown and described with reference to the embodiments thereof, it will be understood by those skilled in the art that various changes in form and details may be made without departing from the spirit and scope of the invention.

What is claimed is:

1. A protocol aware circuit for automatic test equipment, the protocol aware circuit comprising a protocol generation circuit constructed to retrieve protocol unique data and fixed protocol data for a device under test and to format the protocol unique data and the fixed protocol data with a selected protocol definition corresponding to the device under test for testing the device under test.

2. The protocol aware circuit of claim 1, further comprising a protocol definition table, wherein the protocol generation circuit is constructed to retrieve the selected protocol definition from the protocol definition table.

3. The protocol aware circuit of claim 2, wherein the protocol generation circuit comprises a protocol control circuit.

4. The protocol aware circuit of claim 2, wherein the protocol definition table includes action signal data.

5. The protocol aware circuit of claim 1, further comprising a protocol definition table comprising a plurality of protocol definitions for the device under test.

6. The protocol aware circuit of claim 1, further comprising a protocol definition table comprising a plurality of protocol definitions for a plurality of devices under test.

7. A protocol aware circuit for automatic test equipment, the protocol aware circuit comprising:
   a protocol generation circuit constructed to retrieve protocol unique data and format the protocol unique data with a selected protocol definition corresponding to a device under test for testing the device under test;
   a protocol definition table, wherein the protocol generation circuit is constructed to retrieve the selected protocol definition from the protocol definition table, wherein the protocol generation circuit comprises a protocol control circuit, and the protocol control circuit comprises a protocol control storage table in communication with a host device for receiving and storing an operation code and a protocol definition location number.

8. The protocol aware circuit of claim 7, wherein the protocol generation circuit further comprises an action table connected to receive fixed protocol data from the protocol definition table and operation codes from the protocol control storage table to generate fixed protocol data including action signal data for testing the device under test.

9. The protocol aware circuit of claim 7, wherein the protocol generation circuit comprises a protocol unique data storage table.

10. The protocol aware circuit of claim 9, wherein the protocol unique data storage table comprises:
   a) a drive data table containing the protocol unique data for the device under test; and
   b) an expected data table containing the protocol unique data expected as a response from the device under test.

11. The protocol aware circuit of claim 9, wherein the protocol generation circuit comprises a transaction state machine in communication with the protocol control storage table to provide a series of timing cycles used to define the operational actions of a specified device protocol based on the operation code.

12. The protocol aware circuit of claim 11, wherein the protocol control storage table comprises:
   a) an operation code storage device for storing the operation codes and transferring the operation codes in a sequential order to the transaction state machine; and
   b) a transaction location storage device for storing the protocol definition location number and transferring the protocol definition location number to the transaction state machine.

13. The protocol aware circuit of claim 12, wherein the protocol generation circuit further comprises an action table connected to receive fixed protocol data from the protocol definition table and operation codes from the protocol control storage table to generate fixed protocol data including action signal data for testing the device under test.

14. The protocol aware circuit of claim 13, wherein the operation code includes instructions for managing command and control between the protocol aware circuit and the host device.

15. The protocol aware circuit of claim 14 further comprising flow control circuits, and wherein the operation code includes instructions for managing flow control between a plurality of protocol aware circuits.

16. A protocol aware circuit for automatic test equipment, the protocol aware circuit comprising:
   a) a protocol control storage table in communication with a host device for receiving and storing a test pattern including an operation code and a protocol definition location number;
   b) a transaction state machine in communication with the protocol control storage table to provide a series of timing cycles which define the operational actions of a specified device protocol based on the operation code;
   c) a protocol definition table responsive to the transaction state machine for supplying fixed protocol data for a device under test corresponding to the protocol definition location number;
   d) an action table responsive to the transaction state machine to provide action data corresponding with the operation code; and
   e) a protocol unique data storage table in communication with the host device for receiving and storing a test pattern including expected data and drive data, the protocol unique data storage table being responsive to the series of timing cycles to supply protocol unique data corresponding with the fixed protocol data and action data to a pin electronic circuit for testing the device under test.

17. A method for generating signals and timings that comply with a specified device protocol for communication between automatic test equipment and a device under test, the method comprising:
   a) receiving fixed protocol data for the device under test;
   b) receiving protocol unique data; and
   c) with a component of the automatic test equipment, assembling the fixed protocol data and the protocol unique data into the specified device protocol for testing the device under test.

18. The method of claim 17, further comprising:
   a) receiving a protocol definition location number;
   b) selecting fixed protocol data for the specified device protocol from a table location indicated by the protocol m definition location number; and
   c) testing the device under test using the fixed protocol data and the protocol unique data in the specified device protocol.

19. The method of claim 18 further comprising receiving an operation code and retrieving action data from a table location corresponding with the operation code, and supplying the action data along with the fixed protocol data and the protocol unique data in the specified device protocol for testing a device under test.

20. The method of claim 18, wherein retrieving the fixed protocol data for the specified device protocol includes retrieving action data, and wherein testing comprises using the action data.

21. The method of claim 18 further comprising storing and supplying protocol definition location numbers, operation codes, and protocol unique data in a sequential order.

22. The method of claim 18, wherein receiving the protocol definition location number and retrieving the fixed protocol data comprises using a state machine.

23. The method of claim 22, wherein receiving the protocol definition location number comprises receiving the protocol definition location number from a protocol control storage table and further comprising using the state machine to select the fixed protocol definition from a protocol definition table.

24. The method of claim 23, further comprising using the state machine to receive an operation code from the protocol control storage table and selecting action data from an action table corresponding to the operation code from the protocol control storage table.

25. The method of claim 24, wherein testing comprises supplying the protocol unique data from a protocol unique data storage table.

26. The method of claim 25 further comprising supplying the fixed protocol data, the action data, and the protocol unique data to pin electronics logic circuits.

27. The method of claim 26 further comprising loading test pattern commands into the protocol control storage table and the protocol unique data storage table.

28. The method of claim 18, wherein receiving the protocol definition location comprises receiving the protocol definition location number from a host device.

29. A general purpose protocol engine comprising:
   a) a protocol definition storage means comprising a protocol definition for a DUT;
   b) a means for selecting and retrieving a protocol definition from the protocol definition storage means; and
   c) a means for providing test data using the protocol definition for testing a DUT by combining fixed protocol data for the DUT and protocol unique data in accordance with the protocol definition.

30. The general purpose protocol engine of claim 29, wherein the protocol definition storage means comprises a protocol definition table comprising the protocol definition required to functionally test the DUT.

31. The general purpose protocol engine of claim 30, wherein the means for providing test data comprises a data storage table and an action table.

32. The general purpose protocol engine of claim 29, wherein the means for selecting and retrieving the protocol definition from the group of stored protocol definitions comprises a protocol control storage table and a protocol definition table, and wherein the means for providing test data with a selected protocol comprises a data storage table and a selector.

* * * * *